United States Patent [19]
Xu

[11] Patent Number: 5,639,357
[45] Date of Patent: Jun. 17, 1997

[54] SYNCHRONOUS MODULATION BIAS SPUTTER METHOD AND APPARATUS FOR COMPLETE PLANARIZATION OF METAL FILMS

[75] Inventor: Zheng Xu, Foster City, Calif.

[73] Assignee: Applied Materials, Santa Clara, Calif.

[21] Appl. No.: 241,648

[22] Filed: May 12, 1994

[51] Int. Cl.⁶ .................................. C23C 14/34
[52] U.S. Cl. ........................ 204/192.3; 204/192.12; 204/192.15; 204/298.03; 204/298.06; 204/298.08; 204/298.09
[58] Field of Search ................ 204/192.12, 192.15, 204/192.17, 192.25, 192.3, 298.03, 298.06, 298.08, 298.09

[56] References Cited

U.S. PATENT DOCUMENTS

| | | | |
|---|---|---|---|
| 4,327,477 | 5/1982 | Yaron et al. | 29/576 B |
| 4,756,810 | 7/1988 | Lamont, Jr. et al. | 204/192.3 |
| 4,816,126 | 3/1989 | Kamoshida et al. | 204/192.3 |
| 4,994,162 | 2/1991 | Armstrong et al. | 204/192.3 |
| 4,999,096 | 3/1991 | Nihei et al. | 204/192.3 |
| 5,108,570 | 4/1992 | Wang | 204/192.3 |
| 5,175,608 | 12/1992 | Nihei et al. | 204/192.3 |

FOREIGN PATENT DOCUMENTS 0 544 648 A2  6/1993  European Pat. Off. ...... H01L 21/321

OTHER PUBLICATIONS

"Significant Improvement in Step Coverage Using Bias Sputtered Aluminum" (Skelly/Gruenke) *J.Vac.Sci.Technol.* A4(3), May 6/Jun. 1986, pp. 457-160.

*Primary Examiner*—R. Bruce Breneman
*Assistant Examiner*—Rodney G. McDonald
*Attorney, Agent, or Firm*—Fish & Richardson, P.C.

[57] ABSTRACT

A method for producing planarized metal films on a substrate which includes the steps of depositing a thin film of a metal onto the substrate; after the thin film is deposited, generating vacancies in the deposited thin film of metal to increase the mobility of the metal atoms of the deposited thin film; after generating vacancies within the deposited thin film of metal and before depositing any more metal, heating the surface of the deposited thin film to cause a reflow of the metal in the thin metal film; and repeating the above sequence of steps until a metal layer is formed having a predetermined thickness.

34 Claims, 2 Drawing Sheets

PHASE I    PHASE II    PHASE III

SYNCHRONOUS MODULATION BIAS SPUTTER METHOD AND APPARATUS FOR COMPLETE PLANARIZATION OF METAL FILMS

BACKGROUND OF THE INVENTION

The invention relates to a method for planarizing metal films that are deposited on substrates, such as semiconductor wafers which are used for fabricating integrated circuits.

The semiconductor fabrication of VLSI (Very Large Scale Integration) circuits generally involves many stages of processing. One or more of those stages of processing typically involve depositing a metal layer onto an insulating layer (e.g. $SiO_2$) that partially covers the surface of the wafer. The insulating layer, which was produced during earlier stages of processing, includes an array of contact holes that extend down to devices that have been formed in the underlying semiconductor wafer. The metal layer serves, among other things, to provide conductive interconnects between devices within the integrated circuit. To achieve good electrical contact to the underlying devices, the deposited metal layer must fill the contact holes.

As the capabilities of semiconductor fabrication technology advanced, device size dramatically decreased and, not surprisingly, the dimensions of the openings to the contact holes also decreased. This created certain problems for the metalization stage of processing. The contact holes, which due to their smaller openings now had higher aspect ratios (i.e., ratio of depth to width), were more difficult to fill with metal. Because of the shadowing effect of the walls of the contact holes, the rate of metal deposition on the bottom of the holes was not as high as on the top surface of the wafer. In addition, deposited metal tends to accumulate near the rim of the contact hole at the surface of the insulating layer thereby further masking the hole from receiving metal during deposition.

The reduced device dimensions and the more complex multi-layered device structures which came with the advances in technology also produced other problems. The surface of a deposited metal layer tends to follow the contours of the insulating layer on which it is deposited. The surface of the insulating layer, in turn, tends to follow the contours of underlying structures such as previously deposited metal conducting lines and contact openings formed in lower insulating layers during earlier stages of processing. In other words, the surface of the deposited metal layer contains irregularities, which, if not removed, will interfere with efforts to fabricate the submicron structures on the wafer.

To address these problems, a planarizing step was introduced into the fabrication process. Typically, after depositing a metal layer, or even during the metal deposition step itself, the entire wafer is heated to a temperature near the flow point of the metal that was or is being deposited. The higher wafer temperature causes the deposited metal to flow over the surface of the wafer and into the contact holes. The reflow of metal on the wafer fills the contact holes and reduces the irregularities on the surface of the metal. For aluminum, that temperature that is required to achieve effective reflow is around 525°–530° C., for other materials such as copper, it can be much higher (e.g. above 800 ° C.).

However, as fabrication technology advances even further and devices continue to decrease in size, it is also becoming important to reduce the temperature extremes to which the wafer is exposed and the amount of time that the wafer spends at elevated temperatures during processing. Prolonged exposure to high temperatures and the repeated cycling to high temperatures generate stresses in the wafer. The stresses, in turn, tend to produce defects which can destroy the extremely small devices. In addition, long times spent at elevated temperatures during processing also tend to increase unwanted migration of material within the devices. All of this can drastically reduce circuit yields on a wafer. Because of this, integrated circuit manufacturers have begun to impose a tight thermal budgets on their fabrication processes and on the equipment which they use. These thermal budgets are sure to become even tighter in the future as the limits of the technology are pushed even further.

SUMMARY OF THE INVENTION

In general, the invention is an apparatus and method for depositing a planarized metal layer on a substrate without exposing the substrate to the high temperatures that are typical of conventional planarization techniques. The planarization is performed during the deposition process. The method includes three phases of operation which are repeated in sequence until the total desired metal thickness is achieved. During a first phase, a thin metal layer is deposited on the surface of the substrate. During a second phase, the mobility of the metal atoms is enhanced by introducing vacancies or holes into the just-deposited metal layer. During a third phase, the surface of the mobility-enhanced metal layer is heated (e.g. by using an electron beam) to reflow the metal, thereby redistributing it into the contact holes to form interconnects and also reducing irregularities on the surface of the deposited metal layer.

In general, in one aspect, the invention is a method for producing planarized metal films on a substrate. The method includes the steps of depositing a thin film of a metal onto the substrate; generating vacancies in the deposited thin film of metal to increase the mobility of the metal atoms of the deposited thin film; after generating vacancies within the deposited thin film of metal and before depositing any more metal, heating the surface of the deposited thin film to cause a reflow of the metal in the thin metal film; and repeating the above sequence of steps until a metal layer is formed having a predetermined thickness.

Preferred embodiments include the following features. The process is performed in a plasma chamber using a plasma to sputter deposit metal from a target onto the substrate to produce the thin metal film. The metal deposition step involves biasing the target to a negative voltage relative to ground. The next vacancy generating step involves biasing the wafer to a negative voltage relative to ground and bombarding the deposited thin film with plasma-generated ions to produce the vacancies. The heating phase involves biasing the wafer to a positive voltage relative to ground and bombarding the surface of the deposited thin film of metal with electrons.

In general, in another aspect, the invention is a method for producing planarized metal films on a substrate that includes heating the substrate to a predetermined temperature; depositing a thin film of a metal onto the substrate; after depositing the thin film, bombarding the deposited thin film with ions to produce vacancies in the deposited thin film of metal and to thereby increase the mobility of the metal atoms in the deposited thin film; and repeating the above depositing step followed by the bombarding step until a metal layer is formed having a predetermined thickness. In this method, the bombarding ions have an energy that is less than the sputter energy threshold of the deposited thin film.

In general, in yet another aspect, the invention is an apparatus for producing a planarized metal layer on a substrate from a target made of a preselected metal. The apparatus includes a sputter deposition chamber including a source assembly adapted to hold the target during processing, a platform adapted to hold the substrate during processing, and an RF antenna located between the source assembly and the platform. There is also an RF power supply connected to the RF antenna, a first power supply generating a target voltage that varies as a function of time, a second power supply generating a platform voltage also varying as a function of time, and a control unit controlling both the first and second power supplies. The control unit is programmed to cause the first and second voltages to have the following characteristics: (1) during a first period, the first voltage is $V_{11}$, where $V_{11}$ is sufficiently negative to sputter the target; (2) during a second period following the first period, the first voltage is $V_{12}$ and the second voltage is $V_{22}$, wherein the magnitude of $V_{12}$ is substantially lower than the magnitude of $V_{11}$ so as to produce a significantly reduced target sputtering rate, and wherein $V_{22}$ is sufficiently negative to produce an ion bombardment of the substrate; and (3) during a third period following the second period, the first voltage is $V_{13}$ and the second voltage is $V_{23}$, wherein the magnitude of $V_{13}$ is substantially lower than the magnitude of $V_{11}$ so as to produce a significantly reduced target sputtering rate, and wherein $V_{23}$ is sufficiently positive to produce an electron bombardment of the substrate. In this system, one cycle of operation is defined as a sequence made up of the first, second and third periods, and the control unit is programmed to repeat that cycle of operation many times.

The invention eliminates the need for a subsequent reflow or anneal step to achieve planarization. It also significantly reduces the temperatures to which the wafer must be exposed during the planarization phase of processing.

The preferable electron beam heating has the further advantage that it primarily heats the surface of the deposited metal layer rather than the underlying structures and substrate. Since the temperature increase is concentrated at the surface of the recently deposited metal layer, where it advantageously enhances the reflow of metal, less damage is done to the rest of the wafer by avoiding thermal stresses associated with cycling to high temperatures.

Other advantages and features will become apparent from the following description of the preferred embodiment and from the claims.

DESCRIPTION OF THE PREFERRED
EMBODIMENT(s)

1. Hardware

Figure 1:
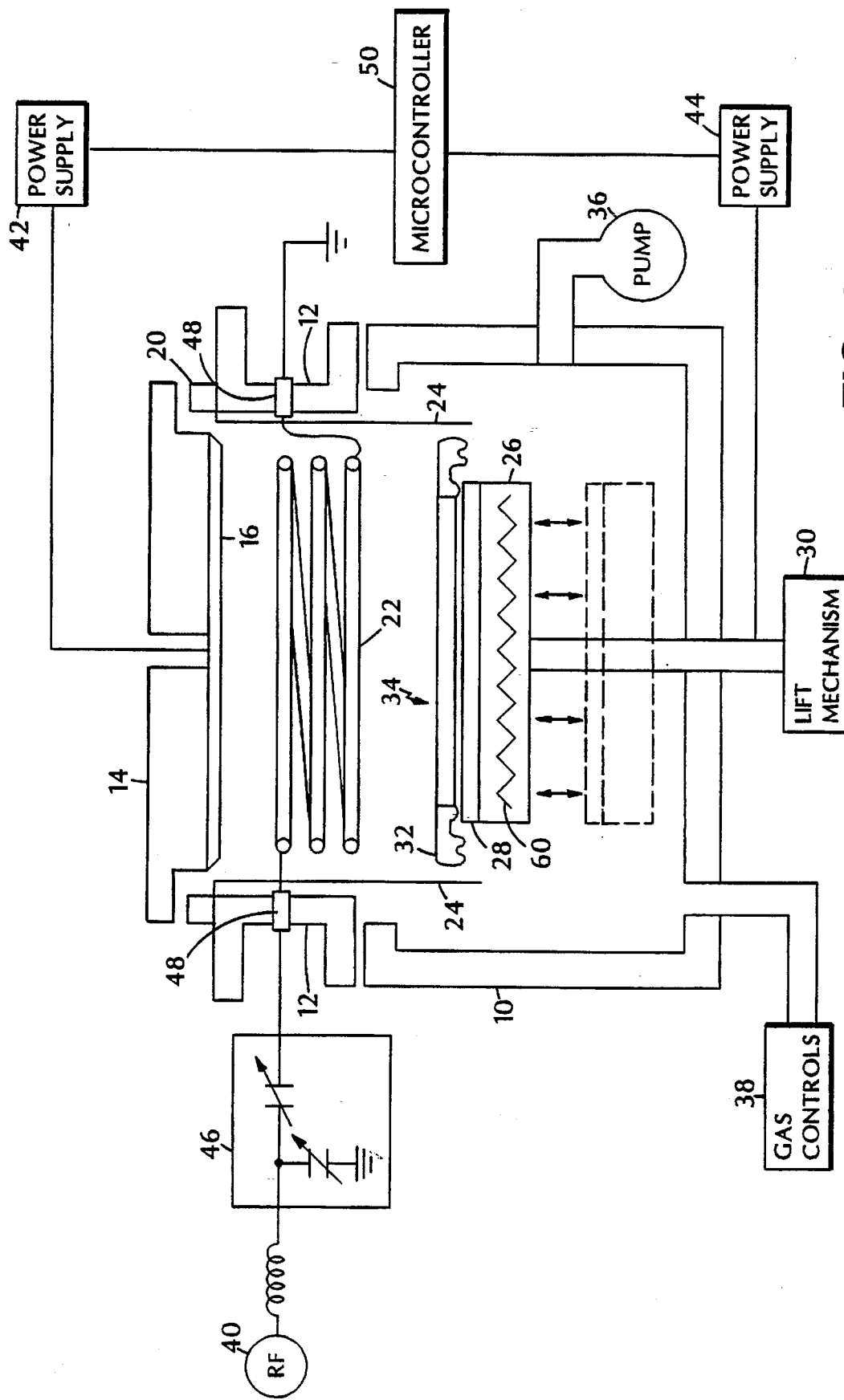
FIG. 1 shows a sputtering system in which the invention is carried out.
Figure 2:
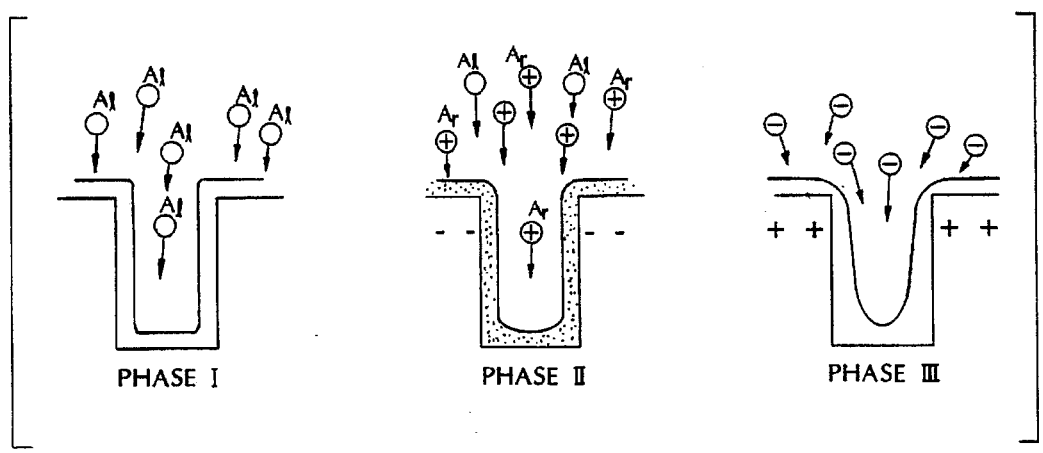
FIG. 2 illustrates the three phases of the planarization method.

The planarization method which is the subject of this invention can be carried out in any of a variety of commercially available sputter deposition systems. For the described embodiment, an Endura 5500 PVD (physical vapor deposition) system which is manufactured and sold by Applied materials, Inc., of Santa Clara, Calif. is used. The sputtering chamber that normally comes with that system is modified to accommodate an internal RF coil. The principle components of the sputter deposition system are shown schematically in FIG. 1.

The sputter deposition system includes a chamber body 10, an adapter 12, and a source assembly 14 containing a sputtering target 16. In the described embodiment, the sputtering source is a magnetron which includes a set of magnets (not shown) positioned behind an aluminum sputtering target. The source assembly (including the sputtering target) is electrically isolated from the rest of the chamber by an insulator ring 20. The adapter 12 extends the upper part of the chamber to make room for an internal RF coil antenna 22, which is made from copper tubing. Around the inside circumference of the chamber above the wafer pedestal, there is a grounded metal shield 24 which confines the plasma that is formed within the chamber to the region above the wafer and prevents the sputtered atoms from reaching the chamber body.

A movable platform 26 within the chamber holds a wafer 28 on which material sputtered from target 16 is deposited. The platform can be raised and lowered by a mechanical lift mechanism 30. After the wafer is placed on the platform, the lift mechanism raises the wafer until it contacts a clamping ring 32. The clamping ring, which has a central aperture 34 that is slightly smaller than the diameter of the wafer, shields the platform from deposition material during processing.

A vacuum pump 36, which is connected to the chamber, is used to evacuate the chamber for a process run. Gas control circuitry 38 is used to control the flow of inert gas (e.g. Ar) in and out of the chamber during processing and to thereby achieve the desired gas pressure during sputtering.

The system also includes a conventional RF power source 40 and two conventional modulated DC power supplies 42 and 44, whose output voltages can be controlled by a control signal. The RF power source, which generates a selectable frequency within the range of 400 KHz to 60 MHz, is connected through a matching network 46 to coil 22. Voltage feed throughs 48 are provided in the side of the chamber to allow an electrical connection to made to the RF antenna inside the chamber. Power supply 42 is connected between the target and ground potential. Power supply 44, which has a controllable output polarity, is connected between the pedestal/wafer and ground potential. A conventional microcontroller 50 generates the control signals that control the operation of both DC power supplies 42 and 44 to generate and synchronize the voltage waveforms that are required to perform the deposition/planarization process as described below.

The pressure and flow rates that are used are typical of those which would be used during a conventional sputter deposition process. For example, the pressure of Ar is typically set to less than about 100 mTorr and often as low as 0.5 mTorr or even lower. For such pressures, typical Ar flow rates may be between about 10 to 140 sccm (standard cubic centimeters per minute). Of course, these parameters may be adjusted to optimize the process for the particular power levels, gas atmosphere, and chamber geometries that are used.

2. The Three Phase Process

The deposition/planarization process has three phases of operation referred to below as Phase I, Phase II, and Phase III. During Phase I, a thin layer of Al is sputter deposited on the surface of the wafer (e.g. 10–50 Å). During Phase II the surface of the wafer is bombarded with low energy $Ar^+$ ions (e.g. 100 eV) to generate vacancies or holes within the just-deposited thin layer of Al. During Phase III, the surface of the wafer is bombarded by electrons which excite the surface of the wafer to facilitate a reflow of the metal layer. The three phase sequence is repeated many times until the desired overall thickness of metalization is achieved.

Figure 3:
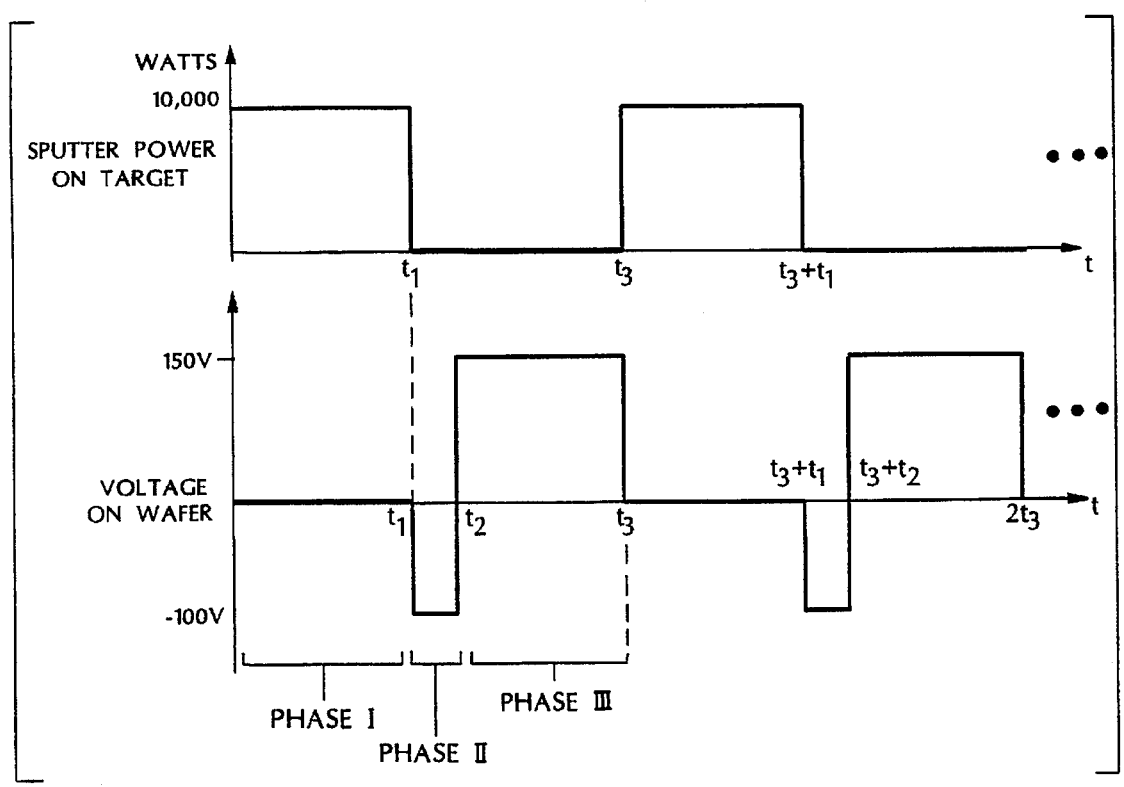
FIG. 3 shows the power that is supplied to the target and the voltage waveform that is applied to the wafer/platform (both as a function of time) to produce the three phases of operation.

The three phases of operation are generated by the particular voltage waveforms that are applied to the target and the wafer. The voltage applied to the target is shown in the upper half of FIG. 3 and the voltage that is applied to the wafer/platform is shown in the lower half of FIG. 3. Throughout the process, RF supply 40 is set to deliver a constant power (e.g. between 300–2500 watts) to the RF antenna to inductively generate an RF plasma within the chamber. The inductively generated RF plasma serves to enhance sputtering during Phase I, to provide the source of $Ar^+$ ions for vacancy generation during Phase II, and to provide the source of electrons during Phase III. In the described embodiment, processing a wafer that is about 200 mm in diameter is done using an RF frequency of 400 KHz and RF power of about 300–400 watts.

During Phase I, the target voltage is set to a negative 500 volts to generate a sputtering plasma above the target while the RF power supplied to the internal antenna is generating a second Ar plasma. The RF induced plasma acts to enhance sputtering efficiency during this phase of operation by increasing the amount of $Ar^+$ ions that are produced. While sputtering is taking place, the wafer voltage is either set to zero or allowed to float at a voltage level that is dictated by the plasma. To enable the wafer voltage to float, the DC power supply 44 is adapted to disconnect from the platform during this phase of operation. Under these operating conditions, the current to the target is about 20 amperes (i.e., about 10 KWatts of power is being supplied to the target) which yields a deposition rate of about 10,000 Å/minute. The duration of Phase I (i.e., time $t_1$ in FIG. 4) is between about 10–100 msec, the precise value depending, of course, on how much metal one wants to deposit. If, for example, $t_1$ is set to about 60 msec, about 10 Å of Al will be deposited during Phase I. The optimum thickness for the Al layer deposited during Phase I is the maximum depth to which the ion bombardment will penetrate during Phase II, as will be explained below.

During Phase II, the RF power to the antenna remains at the same level and the power to the target is reduced sufficiently to effectively stop the sputtering process. However, it is preferable to avoid shutting off the target power completely so as to maintain some minimal deposition rate (e.g. a few Å/min). The minimal deposition rate serves to keep a fresh surface during this phase of operation. If the sputter deposition were to be completely turned off, the surface of the Al layer would be more likely to collect contaminants (e.g. oxygen and/or nitrogen atoms) which would have a deleterious effect on the quality of the metal layer and would tend to interfere with reflow.

In the described embodiment, the background power level to the target during Phase II (and continued during Phase III) is reduced to about 500 Watts by dropping the target voltage to about −250 volts. Thus, the resulting deposition rate during Phase II is about 5% of the rate achieved at full power operation.

At the same time the target power is reduced at the beginning of Phase II, the microcontroller 50 causes the power supply 44 to switch the voltage on the wafer from its zero voltage (or alternatively, its free floating condition) to a voltage sufficiently negative to attract argon ions so they bombard the wafer, preferably between −20 to −150 volts (e.g. −100 volts). Thus, the positively charged $Ar^+$ ions that are being generated by the RF induced plasma within the chamber cavity are drawn toward and bombard the surface of the negatively charged wafer. The resulting current is about 5–10 amperes.

The $Ar^+$ ions bombarding the surface of the wafer penetrate into and generate vacancies within that metal layer. It is desirable to set the voltage on the wafer to a sufficiently high negative voltage so that the $Ar^+$ ions penetrate the just-deposited metal layer and produce vacancies distributed throughout it (i.e. above 20 eV for Al). However, it is also desirable to avoid setting the voltage so high as to cause reverse sputtering of the wafer (i.e., sputter etching off of the wafer some of the material deposited on the wafer during Phase I) or to cause the ions to penetrate through the metal layer and into the underlying substrate where they may damage devices. In other words, the bombarding ions will have an energy that is less than the threshold energy that is required to sputter metal atoms off of the surface (referred to hereinafter as the sputtering energy threshold).

During Phase II, the production of vacancies within the deposited layer reduces the density of the deposited Al layer and increases the mobility of the Al atoms within that layer. Thus, the effective diffusion coefficient of the Al atoms within that layer is increased sufficiently so as to produce significant reflow of Al at temperatures well below the flow point temperature for Al (i.e., 525°–530° C.).

In the described embodiment, the ion bombardment which occurs during Phase II is allowed to continue for about 1–5 msec. The objective is to generate a vacancy concentration in the range of about 1–10% (i.e., for every 100 Al atoms within that layer, one Al atom is displaced by the bombarding ions). That is, the concentration of vacancies is raised sufficiently so as to increase the mobility of the Al atoms enough to cause an appreciable reflow of material during Phase III. If the vacancy concentration is too low, reflow will not be enhanced significantly and/or higher temperatures will be required during Phase III. On the other hand, if the vacancy concentration is increased too much, the metal will become amorphous which may be undesirable.

Note also that it is desirable to limit the amount of metal that is deposited during Phase I. If the deposited layer is too thick, the ion bombardment of Phase II will not be able to produce vacancies throughout the just-deposited layer.

During Phase III, the RF power to the antenna remains on, the target power remains at its reduced level, and the voltage on the wafer is switched to a positive value between about 100–200 volts (e.g. see 150 volts in FIG. 3) to cause electron bombardment of the wafer. The voltage should be set high enough so that the electron bombardment heats the just-deposited metal layer sufficiently to promote diffusion and reflow of the aluminum. However, the voltage should not be set so high as to cause the electrons to penetrate the metal layer where they will heat up the underlying wafer and/or possibly cause radiation damage to the devices. At about 150 volts the resulting current is about 15–20 amperes.

It is desirable to select the duration of Phase III (i.e., $t_3-t_2$) to be long enough relative to the entire three-phase cycle to achieve a high enough surface temperature on the metal layer to produce an effective reflow of metal. In the described embodiment, the duration of Phase III is set to between 20–50 msec. It is believed that the resulting duty cycle causes the surface layer to heat up to about 300°–350° C. Though this is still well below the flow point of Al, due to the enhanced mobility of Al atoms in the layer, it nevertheless achieves effective diffusion and redistribution (i.e., planarization) of the deposited metal layer. Thus, the electron beam heating which occurs during Phase III causes the deposited layer of Al to diffuse into the contact holes and corners.

Typically, the desired thickness of the Al metalization is about 6000 Å. Given the operating conditions described above, the three phase sequence must be repeated about 600 times to achieve this thickness.

Other embodiments are within the following claims. For example, sputter sources other than a magnetron source could be used and other target materials can be used for the target (e.g. Cu, Au, and Sn, to name a few). In addition, heating techniques other than electron beam can be used to heat the surface of the wafer, e.g. a laser could be used. Also, the phases may be overlapped; for example, if a laser is used to heat the surface of the deposited metal in Phase III, that heating may be performed concurrently with al or part of Phase II. In yet other embodiments, Phase III can be eliminated and a heater element 60 in the platform 26 5 used to heat the wafer to a high enough temperature to achieve appreciable reflow and diffusion of the vacancy enhanced metal layer.

Also note that the process parameters described above were for illustrative purposes. It is anticipated that they can vary widely depending upon the particular system in which the process is being performed, the metal that is being deposited, and the characteristics of the deposited layer that are desired. For example, it may be desirable to deposit a thicker layer of metal during Phase I, or it may be desirable to change the duty cycle to control the amount of heating that occurs during Phase III. All such modifications fall within the scope of the claimed invention.

What is claimed is:

1. A method for producing a planarized film on a substrate, said method comprising:
   depositing a film of a material onto the substrate;
   generating vacancies in the deposited film of material to increase the mobility of the atoms of the deposited film;
   heating the surface of the deposited film to a sufficient degree to cause a reflow of the material in the deposited film; and
   repeating the above sequence of steps until a layer of material is formed having a predetermined thickness.

2. The method of claim 1 wherein within the sequence of steps, the vacancy generating step occurs after the film is deposited, and the surface heating step occurs after generating vacancies within the deposited film of material and before depositing any more material.

3. The method of claim 2 further comprising using a metal for said material so that the deposited film is a deposited metal film.

4. The method of claim 3 wherein the step of heating the surface of the deposited film is performed using a different mechanism from that used to perform the vacancy generating step.

5. The method of claim 4 wherein the step of depositing comprises using a plasma to sputter deposit metal from a target onto the substrate to produce the metal film.

6. The method of claim 5 wherein the step of depositing further comprises biasing the target to a negative voltage relative to ground.

7. The method of claim 4 wherein the step of generating vacancies comprises bombarding the deposited film with ions to produce the vacancies.

8. The method of claim 7 wherein the step of generating vacancies further comprises using a plasma to generate the ions that produce the vacancies.

9. The method of claim 8 wherein the step of generating vacancies further comprises biasing the wafer to a negative voltage relative to ground.

10. The method of claim 4 wherein the step of heating the surface of the deposited film of metal comprises bombarding the surface of the deposited film of metal with electrons.

11. The method of claim 10 wherein the step of heating the surface of the deposited film of metal comprises using a plasma to generate the electrons that bombard the surface of the deposited film of metal.

12. The method of claim 11 wherein the step of heating the surface of the deposited film of metal further comprises biasing the wafer to a positive voltage relative to ground.

13. The method of claim 3 further comprising performing the depositing, generating, and heating steps in a plasma chamber.

14. The method of claim 13 further comprising prior to performing the depositing, generating, and heating steps, evacuating the plasma chamber, introducing an inert gas into the plasma chamber, and generating a plasma in the plasma chamber.

15. The method of claim 14 wherein the inert gas is argon.

16. The method of claim 14 wherein the step of depositing comprises sputter depositing metal from a target onto the substrate to produce the metal film.

17. The method of claim 16 wherein the step of depositing further comprises negatively biasing the target relative to ground.

18. The method of claim 17 wherein the step of generating vacancies comprises bombarding the deposited film with ions to produce the vacancies.

19. The method of claim 18 wherein the step of generating vacancies further comprises using the plasma to generate the ions that produce the vacancies.

20. The method of claim 19 wherein the step of generating vacancies further comprises reducing the negative bias on the target and negatively biasing the wafer relative to ground.

21. The method of claim 20 wherein the step of heating the surface of the deposited film of metal comprises bombarding the surface of the deposited film of metal with electrons.

22. The method of claim 21 wherein the step of heating the surface of the deposited film of metal comprises using the plasma to generate the electrons that bombard the surface of the deposited film of metal.

23. The method of claim 22 wherein the step of heating the surface of the deposited film of metal further comprises positively biasing the wafer relative to ground.

24. The method of claim 14 wherein the metal is selected from a group of metals consisting of aluminum, copper, gold, tin and compounds thereof.

25. The method of claim 24 wherein the metal is aluminum.

26. A method for producing a planarized metal film on a substrate, said method comprising:
   depositing a film of a metal onto the substrate at a first deposition rate;
   next, depositing the film of metal at a second deposition rate that is lower than the first rate while also commencing bombardment of the deposited film with ions having an energy that is less than the sputter threshold energy of the deposited film to produce vacancies in the deposited film of metal and to thereby increase the mobility of the metal atoms in the deposited film; and
   repeating the above-referenced sequence of depositing at a first deposition rate step followed by the depositing at a second rate while commencing bombardment step until a metal layer is formed having a predetermined thickness.

27. An apparatus for producing a planarized metal layer on a substrate using a metal target; said apparatus comprising:

a sputter deposition chamber including a source assembly adapted to hold the target during processing;

a platform within the chamber, said platform adapted to hold the substrate during processing;

a first power supply generating a first voltage on the target, said first voltage varying as a function of time;

a second power supply generating a second voltage on the platform, said second voltage varying as a function of time; and a control unit controlling both the first and second power supplies, said control unit programmed to cause the first and second voltages to have predetermined characteristics, said predetermined characteristics being that:

during a first period, the first voltage is $V_{11}$, said value $V_{11}$ being sufficiently negative to sputter the metal target;

during a second period following the first period, the first voltage is $V_{12}$ and the second voltage is $V_{22}$, wherein the magnitude of $V_{12}$ is substantially lower than the magnitude of $V_{11}$ so as to produce a significantly reduced target sputtering rate, and wherein $V_{22}$ is sufficiently negative to produce an ion bombardment of the substrate; and during a third period following the second period, the first voltage is $V_{13}$ and the second voltage is $V_{23}$, wherein the magnitude of $V_{13}$ is substantially lower than the magnitude of $V_{11}$ so as to produce a significantly reduced target sputtering rate, and wherein $V_{23}$ is sufficiently positive to produce an electron bombardment of the substrate.

28. The apparatus of claim 27 wherein one cycle of operation is defined as a sequence made up of the first, second and third periods, and wherein the control unit is programmed to repeat said cycle of operation many times.

29. A method for producing a planarized metal film on a substrate, said method comprising:

heating the substrate to a predetermined temperature;

depositing a film of a metal onto the substrate, wherein the depositing step is performed on a heated substrate;

after the film is deposited, bombarding the deposited film with ions to produce vacancies in the deposited film of metal and to thereby increase the mobility of the metal atoms in the deposited film, wherein the bombarding ions have an energy that is less than the sputter threshold energy of the deposited film; and repeating the above-referenced sequence of the depositing step followed by the bombarding step until a metal layer is formed having a predetermined thickness.

30. The apparatus of claim 27 further comprising:

an RF antenna within said chamber located between the source assembly and the platform; and an RF power supply connected to the RF antenna and for providing RF power to the RF antenna.

31. The method of claim 26, wherein the second deposition rate is substantially less than the first deposition rate.

32. The method of claim 31, wherein the second deposition rate is less than about 5% of the first deposition rate.

33. The apparatus of claim 27, wherein the electron bombardment heats the substrate sufficiently to enhance reflow of the metal layer.

34. The apparatus of claim 27, wherein the bombarding ions have an energy that is less than the sputter threshold energy of the metal in the metal layer.

* * * * *